(12) United States Patent
Kanaoka et al.

(10) Patent No.: US 10,987,738 B2
(45) Date of Patent: Apr. 27, 2021

(54) SURFACE-COATED CUTTING TOOL

(71) Applicant: SUMITOMO ELECTRIC HARDMETAL CORP., Itami (JP)

(72) Inventors: Hideaki Kanaoka, Sorachi-gun (JP); Shinya Imamura, Sorachi-gun (JP); Anongsack Paseuth, Sorachi-gun (JP); Yuta Koyoshi, Sorachi-gun (JP); Satoshi Ono, Sorachi-gun (JP); Kouhei Yoshimura, Sorachi-gun (JP)

(73) Assignee: Sumitomo Electric Hardmetal Corp., Itami (JP)

( * ) Notice: Subject to any disclaimer, the term of this patent is extended or adjusted under 35 U.S.C. 154(b) by 56 days.

(21) Appl. No.: 16/308,996

(22) PCT Filed: Feb. 17, 2017

(86) PCT No.: PCT/JP2017/005796
§ 371 (c)(1),
(2) Date: Dec. 11, 2018

(87) PCT Pub. No.: WO2017/217012
PCT Pub. Date: Dec. 21, 2017

(65) Prior Publication Data
US 2019/0232380 A1   Aug. 1, 2019

(30) Foreign Application Priority Data
Jun. 14, 2016   (JP) .............................. JP2016-117931

(51) Int. Cl.
| | | |
|---|---|---|
| *B23B 27/14* | (2006.01) | |
| *B23F 21/00* | (2006.01) | |
| *B23G 5/06* | (2006.01) | |
| *B23B 51/00* | (2006.01) | |
| *B23C 5/16* | (2006.01) | |
| *B23D 77/00* | (2006.01) | |
| *C23C 16/30* | (2006.01) | |

(52) U.S. Cl.
CPC .............. *B23B 27/14* (2013.01); *B23B 51/00* (2013.01); *B23C 5/16* (2013.01); *B23D 77/00* (2013.01); *B23F 21/00* (2013.01); *B23G 5/06* (2013.01); *C23C 16/30* (2013.01); *B23B 2222/28* (2013.01); *B23B 2228/10* (2013.01)

(58) Field of Classification Search
CPC ..... B23B 27/14; B23B 51/00; B23B 2222/16; B23B 2222/18; B23B 2224/04; B23B 2224/08; B23B 2224/12; B23B 27/00; B23C 5/16; B23D 77/00; B23G 5/00; B24B 2224/16; B24B 2224/20; B24B 2224/24; B24B 2224/28; B24B 2224/32; B24B 2224/36; B24B 2224/40
See application file for complete search history.

(56) References Cited

U.S. PATENT DOCUMENTS

| | | | |
|---|---|---|---|
| 2004/0180241 A1 | 9/2004 | Rodmar et al. | |
| 2005/0042482 A1* | 2/2005 | Okada | C23C 16/30 428/698 |
| 2012/0202032 A1* | 8/2012 | Tatsuoka | C23C 30/005 428/216 |
| 2015/0064431 A1 | 3/2015 | Sottke et al. | |
| 2016/0175939 A1* | 6/2016 | Tanaka | C23C 14/0641 428/216 |

FOREIGN PATENT DOCUMENTS

| | | | |
|---|---|---|---|
| CN | 1517450 A | | 8/2004 |
| JP | 2003-266212 A | | 9/2003 |
| JP | 2003266212 A | * | 9/2003 |
| JP | 2004-090095 A | | 3/2004 |
| JP | 2008-132547 A | | 6/2008 |
| JP | 4251990 B2 | | 1/2009 |
| JP | 2012-213853 A | | 11/2012 |
| JP | 2015-182209 A | | 10/2015 |
| JP | 2015182209 A | * | 10/2015 |

* cited by examiner

*Primary Examiner* — Bryan D. Ripa
*Assistant Examiner* — Ying-Ting Chen
(74) *Attorney, Agent, or Firm* — Baker Botts L.L.P.; Michael A. Sartori

(57) ABSTRACT

A surface-coated cutting tool includes a substrate and a coating that is disposed on the substrate and formed so as to cover at least a portion of a flank face, in which the coating includes an inner layer and an outer layer formed on the inner layer, the inner layer is formed of at least one layer and includes an aluminum oxide layer as a layer in contact with the outer layer, the outer layer has a multilayer structure that includes three or more layers stacked on top of one another, and each of the layers that constitute the multilayer structure contains titanium.

5 Claims, No Drawings

SURFACE-COATED CUTTING TOOL

TECHNICAL FIELD

The present invention relates to a surface-coated cutting tool. The present application claims priority based on Japanese Patent Application No. 2016-117931 filed on Jun. 14, 2016. All the contents described in the Japanese patent application are incorporated herein by reference.

BACKGROUND ART

As regards a surface-coated cutting tool, protection from, for example, crater wear and plastic deformation that are generated due to heat during cutting work and development to further improve various characteristics such as wear resistance and toughness have been conventionally made by covering a surface of a substrate with a coating. As the coating, carbides, nitrides, and carbonitrides of group-4 metals in the periodic table (such as TiC, TiN, and TiCN) are commonly used for a purpose of improving cutting characteristics at high temperature. A layer containing aluminum oxide ($Al_2O_3$) is also commonly used as the coating for covering this kind of substrate because $Al_2O_3$ is chemically stable and hardly adheres to a workpiece.

Japanese Patent Laying-Open No. 2008-132547 (PTL 1) proposes a surface-coated cutting tool whose coating includes an outermost layer having lowered adhesion strength for a purpose of increasing deposition resistance. Japanese Patent Laying-Open No. 2012-213853 (PTL 2) proposes a surface-coated cutting tool obtained by performing surface finishing after formation of a coating to set surface roughness Ra of a rake face to 0.12 μm and applying compressive residual stress to increase toughness.

CITATION LIST

Patent Literatures

PTL 1: Japanese Patent Laying-Open No. 2008-132547
PTL 2: Japanese Patent Laying-Open No. 2012-213853

SUMMARY OF INVENTION

A surface-coated cutting tool according to one aspect of the present disclosure is a surface-coated cutting tool that includes a substrate and a coating that is disposed on the substrate and formed so as to cover at least a portion of a flank face, in which the coating includes an inner layer and an outer layer formed on the inner layer, the inner layer is formed of at least one layer and includes an aluminum oxide layer as a layer in contact with the outer layer, the outer layer has a multilayer structure that includes three or more layers stacked on top of one another, and each of the layers that constitute the multilayer structure contains titanium.

DETAILED DESCRIPTION

Problem to be Solved by the Present Disclosure

The surface-coated cutting tool described in PTL 1, however, is rough on a surface of a cutting edge portion formed of a cutting edge ridge that is a part where a flank face intersects with a rake face, and a vicinity region of the cutting edge ridge, and the surface-coated cutting tool has left room for improvement of deposition resistance. As regards the surface-coated cutting tool described in PTL 2, the surface roughness Ra of the rake face has been improved but the deposition resistance has been insufficient. Accordingly, desired deposition resistance has not been realized yet and development for realizing such deposition resistance is earnestly desired.

The present disclosure has been made in view of the circumstances described above and an object of the present disclosure is to provide a surface-coated cutting tool that has remarkably improved deposition resistance.

Advantageous Effect of the Present Disclosure

According to the foregoing, it is possible to provide a surface-coated cutting tool that has remarkably improved deposition resistance.

Description of Embodiments

The present inventors have seriously and repetitively studied to solve the above problem and attained the present invention. That is, an outer layer of a coating has been made to have, as a structure, a multilayer structure including three or more layers stacked on top of one another and each of the layers constituting the multilayer structure has been made to contain titanium to relax stress on a surface-coated cutting tool during cutting work and thus increase the deposition resistance.

First, the present invention is described by way of aspects below.

[1] A surface-coated cutting tool according to one aspect of the present invention is a surface-coated cutting tool that includes a substrate and a coating that is disposed on the substrate and formed so as to cover at least a portion of a flank face, in which the coating includes an inner layer and an outer layer formed on the inner layer, the inner layer is formed of at least one layer and includes an aluminum oxide layer as a layer in contact with the outer layer, the outer layer has a multilayer structure that includes three or more layers stacked on top of one another, and each of the layers that constitute the multilayer structure contains titanium. The surface-coated cutting tool having such a configuration is capable of remarkably improving the deposition resistance. In addition, the surface-coated cutting tool is capable of maintaining excellent wear resistance of a conventional surface-coated cutting tool. It is possible to provide a surface-coated cutting tool capable of achieving long life, by obtaining excellent deposition resistance as well as the inherent wear resistance.

[2] The coating includes a plurality of voids in an interface between the inner layer and the outer layer, and the voids preferably have an average diameter of greater than or equal to 10 nm and less than or equal to 100 nm and have a density of 0.1 to 2 pieces/μm on a cross-sectional surface of the coating obtained by cutting the coating along a plane in parallel with a normal to the flank face. This enables the surface-coated cutting tool to have further excellent deposition resistance.

[3] A cutting edge portion of the surface-coated cutting tool preferably has a surface roughness Ra of less than or equal to 0.1 μm. This enables the surface-coated cutting tool to have more excellent deposition resistance while maintaining excellent wear resistance.

[4] The multilayer structure preferably includes a titanium carbide layer and a titanium nitride layer. The titanium carbide layer having a low coefficient of thermal expansion is capable of reducing tensile stress after stacking and the titanium nitride layer enables the surface-coated cutting tool to have more excellent heat resistance.

[5] The multilayer structure preferably includes the titanium carbide layer as a layer in contact with the aluminum oxide layer being the layer that is included in the inner layer and is in contact with the outer layer. This enables the surface-coated cutting tool to have further excellent deposition resistance.

[6] The substrate is preferably formed of cemented carbide that contains, as composition, 7.5 to 10.5% by mass of cobalt and 2 to 6% by mass of a carbide of a first metal, with the balance being tungsten carbide and inevitable impurities, and the first metal is preferably at least one metal selected from the group consisting of group-4 elements, group-5 elements, and group-6 elements in a periodic table. This enables the surface-coated cutting tool to have further excellent wear resistance.

[7] The aluminum oxide layer being the layer that is included in the inner layer and is in contact with the outer layer preferably has an average thickness of 0.5 to 4 μm. This enables the surface-coated cutting tool to have further excellent wear resistance and deposition resistance.

Detail of Embodiment of Invention

Hereinafter, the embodiment of the present invention is described in further detail. Here, in the present specification, the expression in a form of "A to B" means an upper limit and a lower limit (that is, greater than or equal to A and less than or equal to B) of a range, and when A is described without a unit but B is described with a unit, the units of A and B are the same.

Further, when a compound or the like is represented by a chemical formula in the present specification and the atomic ratio in the chemical formula is not particularly limited, the chemical formula includes any conventionally known atomic ratios and is not to be always limited to a stoichiometric range. For example, in a case of the description "TiAlN," the ratio of the number of atoms that constitute TiAlN is not limited to Ti:Al:N=0.5:0.5:1 but TiAlN includes any conventionally known atomic ratios. The same also applies to the description of a compound other than "TiAlN." In the present embodiment, a metal element such as titanium (Ti), aluminum (Al), silicon (Si), tantalum (Ta), or chromium (Cr) does not always have to constitute a stoichiometric composition with a non-metal element such as nitrogen (N), oxygen (O), or carbon (C).

<<Surface-Coated Cutting Tool>>

A surface-coated cutting tool according to the present embodiment includes a substrate and a coating that is disposed on the substrate and formed so as to cover at least a portion of a flank face. The surface-coated cutting tool having such a basic configuration can be suitably used as a cutting tool such as a drill, an indexable cutting insert for a drill, an end-mill, an indexable cutting insert for an end-mill, an indexable cutting insert for milling or turning, a metal-slitting saw, a gear cutting tool, a reamer, a tap, or an indexable cutting insert for pin-milling.

<Substrate>

Any substrate can be used that is conventionally known as this kind of substrate. The substrate is preferably any one of a cemented carbide (including, for example, a WC-based cemented carbide, a cemented carbide containing WC and at least one or both Co and Ni, and cemented carbide obtained by adding a carbide, a nitride, a carbonitride, or the like of Ti, Ta, Nb, Zr, Hf, Cr, V, or the like), a cermet (containing TiC, TiN, TiCN, or the like as a main component), a high-speed steel, a ceramic material (such as titanium carbide, silicon carbide, silicon nitride, aluminum nitride, aluminum oxide, and a mixture of these compounds), a cubic boron nitride sintered body, a diamond sintered body, and the like.

Among these various substrates, it is preferable to select the cemented carbide (particularly, WC-based cemented carbide) or the cermet (particularly, a TiCN-based cermet). These substrates are excellent in balance between hardness and strength at high temperature and have excellent characteristics as the substrate of the surface-coated cutting tool for the uses described above. When used as the substrate, the WC-based cemented carbide may include, in its constitution, for example, free carbon and an abnormal layer such a so-called η phase or ε phase.

Further, the substrate whose surface has been reformed is also used without any problem. For example, the substrate formed of cemented carbide may have a β-free layer formed on a surface thereof, and the substrate formed of cermet may have a surface-hardened layer formed thereon. The substrate whose surface has been thus reformed still exhibits desired effects.

When the surface-coated cutting tool is, for example, an indexable cutting insert, the substrate includes one having or not having a chip breaker. The shape of a cutting edge ridge portion (a difference from the term "cutting edge portion" is described later) of the substrate includes any of a sharp edge (ridge where a rake face intersects with a flank face), a honed edge (one obtained by imparting roundness to the sharp edge), a negative land (chamfer), and one obtained by combining the honed edge and the negative land. Hereinafter, in the present specification, the substrate that has not been subjected to these types of surface finishing is sometimes particularly described as a "base substrate."

Particularly, in the present embodiment, the substrate is preferably formed of a cemented carbide. This cemented carbide contains 7.5 to 10.5% by mass of cobalt and 2 to 6% by mass of a carbide of a first metal, with the balance being tungsten carbide and inevitable impurities. The first metal is at least one metal selected from the group consisting of group-4 elements, group-5 elements, and group-6 elements in the periodic table. Further, the carbide of the first metal preferably includes a cubic crystal. The substrate having such a configuration allows the cemented carbide to effectively exhibit the characteristics of being excellent in balance between hardness and strength at high temperature and enables the surface-coated cutting tool to have excellent wear resistance.

The cemented carbide containing, as composition, a cobalt content of less than 7.5% by mass tends to be damaged. With the cobalt content more than 10.5% by mass, the cemented carbide increases its coefficient of thermal expansion to decrease a difference in the coefficient of thermal expansion between the cemented carbide and the coating, thus tending to make an effect of relaxing stress insufficient.

With the content of the carbide of the first metal less than 2% by mass, the cemented carbide tends to wear. With the content of the carbide of the first metal more than 6% by mass, the cemented carbide decreases a difference in the coefficient of thermal expansion between the cemented carbide and the coating, thus tending to make the effect of relaxing stress insufficient. Specific kinds of metals used as the first metal include group-4 elements (such as Ti, Zr, and Hf), group-5 elements (such as V, Nb, and Ta), and group-6 elements (such as Cr, Mo, and W) in the periodic table.

Specific examples of the carbide of the first metal include TiC, TaC, NbC, and ZrC.

The inevitable impurities included in the composition of the cemented carbide refer to a collective term for elements that are inevitably mixed in during manufacturing of the substrate. The content of each of the elements as the inevitable impurities is 0 to 0.1% by mass, and the total of the elements (that is, the content of the inevitable impurities) is 0 to 0.2% by mass. Accordingly, the inevitable impurities may be included or is not necessarily included in the composition of the cemented carbide. The inevitable impurities include elements such as aluminum, silicon, boron, carbon, nitrogen and oxygen.

In the present embodiment, the composition of the cemented carbide, that is, the composition of the substrate can be measured by the following measuring technique using an energy dispersive X-ray analyzer (EDX: Energy Dispersive X-ray Spectroscopy) equipped with a field emission scanning electron microscope (FE-SEM: Field Emission Scanning Electron Microscopy).

First, a substrate (a substrate covered with a coating when the substrate is covered with the coating) is embedded in resin and the substrate is cut along a plane in parallel with a normal to a flank face of the substrate to expose a cross-sectional surface of the substrate. Subsequently, this cross-sectional surface exposed is polished to produce a polished surface for observation. This polished surface for observation (a substrate part of the polished surface for observation when the substrate is covered with a coating) is observed at any five locations (five fields) using an EDX at a magnification of ×3000 and subjected to elemental analysis to derive values of elements. Last, an average value of values in the five fields is derived for each of the elements, so that it is possible to identify the composition of the cemented carbide. As the resin in which the substrate is embedded, it is possible to use, for example, thermosetting resin.

For polishing the cross-sectional surface of the substrate, it is possible to use a conventionally known method. For example, the cross-sectional surface of the substrate can be subjected to ion-milling using argon ions to give a polished surface for observation that has been flattened and smoothed. The conditions of ion-milling by Ar ions are as follows, for example.

Accelerating voltage: 6 kV
Irradiation angle: 0 to 5° from normal to flank face of substrate
Irradiation time: 6 hours Then, the polished surface for observation of the substrate that has been flattened and smoothed may be subjected to analysis by an EDX equipped with a FE-SEM.

<Coating>

A coating is disposed on the substrate and formed so as to cover at least a portion of a flank face. This enables the coating to improve the characteristics of the surface-coated cutting tool, such as toughness and wear resistance. The coating is preferably formed so as to cover the whole surface of the substrate. In the present embodiment, however, the coating may be formed so as to cover at least a portion of a flank face, and even when the other regions on the substrate include a part not covered with the coating, the state does not depart from the scope of the present invention.

The coating includes an inner layer and an outer layer formed on the inner layer. The coating may be formed by a conventionally known chemical vapor deposition (CVD) method or a physical vapor deposition (PVD) method, and thus the forming method is not to be particularly limited. In the present embodiment, however, the coating, i.e., both the inner layer and the outer layer are preferably formed by a CVD method. The CVD method has a film formation temperature of 800 to 1200° C. that is higher than the film formation temperature of the PVD method, so that the CVD method gives more excellent adhesiveness between the coating and the substrate and more excellent adhesiveness between layers constituting the coating than the PVD method does. In the present embodiment, however, the adhesiveness between the inner layer and the outer layer is intentionally decreased as described later.

The coating preferably has an average thickness of greater than or equal to 2 µm and less than or equal to 25 µm. The upper limit of the average thickness is more preferably 20 µm, further preferably 18 µm and the lower limit of the average thickness is more preferably 3 µm, further preferably 4 µm. The coating having an average thickness of less than 2 µm does not sometimes sufficiently exhibit an action of improving the wear resistance, and the coating having an average thickness of more than 25 µm makes a little difference in the action there of, and sometimes give an economic disadvantage.

(Inner Layer)

The inner layer is a layer formed on a side of the substrate with respect to the outer layer described later and is formed of at least one layer. Accordingly, a layer that is formed on the inner layer's closest side to the substrate is formed so as to be in direct contact with a surface of the substrate.

The inner layer is formed of at least one layer and includes an aluminum oxide layer (hereinafter, sometimes described as an "$Al_2O_3$ layer") as a layer in contact with the outer layer. As described later, the outer layer is, due to its multilayer structure, capable of relaxing stress on the surface-coated cutting tool during cutting work and also has characteristics of being easily peeled. Therefore, the layer that is included in the inner layer and is in contact with the outer layer of the surface-coated cutting tool comes to be exposed to the surface of the surface-coated cutting tool during cutting work, so that the layer in contact with the outer layer is formed of the $Al_2O_3$ layer to be capable of reducing deposition to a workpiece.

Here, the aluminum oxide layer means a layer containing at least $Al_2O_3$ as a portion of the layer (recognized as the $Al_2O_3$ layer when the layer contains greater than or equal to 50% by mass of $Al_2O_3$) and can contain, for example, $ZrO_2$ or $Y_2O_3$ (also considered as adding Zr or Y to $Al_2O_3$). Further, the aluminum oxide layer may contain impurities such as chlorine, carbon, boron, and nitrogen. On the other hand, the $Al_2O_3$ layer includes a case where the composition is only formed of $Al_2O_3$ except the impurities. A crystal structure of $Al_2O_3$ contained in the $Al_2O_3$ layer is not to be particularly limited and includes $\alpha$-$Al_2O_3$, $\kappa$-$Al_2O_3$, $\gamma$-$Al_2O_3$, and amorphous $Al_2O_3$ as well as a mixed state of these structures.

The aluminum oxide layer preferably has an average thickness of 0.5 to 4 µm. The aluminum oxide layer having an average thickness of less than 0.5 µm may possibly give insufficient deposition resistance. The aluminum oxide layer has an average thickness of more preferably greater than or equal to 0.6 µm, further preferably greater than or equal to 0.7 µm. On the other hand, the upper limit of the average thickness of the aluminum oxide layer is 4 µm, preferably less than or equal to 3.7 µm, further preferably less than or equal to 3.5 µm. The aluminum oxide layer having an average thickness of more than 4 µm makes a little difference in the effect of improving the deposition resistance, and sometimes give an economic disadvantage.

The inner layer preferably includes, in addition to the aluminum oxide layer, at least one layer formed of a compound that is made of at least one element selected from the group consisting of group-4 elements (such as Ti, Zr, and Hf), group-5 elements (such as V, Nb, and Ta), and group-6 elements (such as Cr, Mo, and W) in the periodic table, Al, Si, and B, and at least one element selected from the group consisting of carbon, nitrogen, oxygen, and boron. The inner layer including such a layer is capable of improving various characteristics such as wear resistance and improving the adhesiveness between the inner layer and the substrate.

Specific examples of the compound include TiC, TiN, TiCN, TiCNO, TiB$_2$, TiBN, TiBNO, TiCBN, Ti$_2$O$_3$, TiZrCN, ZrC, ZrO$_2$, HfC, HfN, TiAlN, AlCrN, CrN, VN, TiSiN, TiSiCN, AlTiCrN, TiAlCN, ZrCN, ZrCNO, AlN, AlCN, ZrN, and TiAlC.

The inner layer preferably has an average thickness of greater than or equal to 0.5 µm and less than or equal to 20 µm, and the upper limit of the average thickness is more preferably 18 µm, further preferably 15 µm and the lower limit of the average thickness is more preferably 2 µm, further preferably 3 µm. The inner layer having an average thickness of less than 0.5 µm makes an effect of the deposition resistance insufficient, and the inner layer having an average thickness of more than 20 µm makes a little difference in the effect thereof, and sometimes give an economic disadvantage.

(Outer Layer)

The outer layer has a multilayer structure including three or more layers stacked on top of one another. Further, each of the layers constituting the multilayer structure contains titanium. The outer layer is a layer formed on the inner layer as described above and is, due to the multilayer structure, capable of significantly effectively reducing deposition of a workpiece to the surface of the surface-coated cutting tool.

That is, in the surface-coated cutting tool according to the present embodiment, the multilayer structure of the outer layer that includes three or more layers relaxes stress on the surface-coated cutting tool during cutting work and allows the outer layer to be relatively simply peeled to enable prevention of a workpiece from depositing to the outer layer. The prevention of deposition of the workpiece results in prevention of fracture of the coating (inner layer) to make it possible to give excellent wear resistance. Simultaneously, it is possible to prevent a state of a processed surface of the workpiece from degrading.

Each of the layers constituting the multilayer structure of the outer layer contains titanium. Each of the layers is not to be basically limited in terms of its composition as long as the composition includes titanium. For example, the outer layer can be made as a layer formed of a compound made of Ti and at least one element selected from the group consisting of carbon, nitrogen, oxygen, and boron, or as a layer formed of a compound obtained by adding to this compound at least one element selected from the group consisting of Zr, Cr, and Hf in some cases. Examples of such a compound include TiN, TiCN, TiBN, TiCNO, TiZrN, TiZrCrN, and TiC. Each of the layers included in the outer layer contains titanium to enable uniform coverage even when the layer is a thin film.

In the present embodiment, the outer layer preferably includes a titanium carbide layer (hereinafter, sometimes described as a "TiC layer") and a titanium nitride layer (hereinafter, sometimes described as a "TiN layer"). That is, the outer layer preferably includes three or more layers stacked on top of one another while including the TiC layer and the TiN layer. This is because such an outer layer can provide, in addition to the effects of the outer layer described above, excellent heat resistance and an effect of reducing the coefficient of thermal expansion.

Further, the outer layer more preferably includes the TiC layer as a layer in contact with the Al$_2$O$_3$ layer. The TiC layer having characteristics of being easily oxidized is formed in contact with the Al$_2$O$_3$ layer to allow TiC to be oxidized during film formation and thus voids to be easily formed in an interface between the TiC layer and the Al$_2$O$_3$ layer. As described later, these voids are capable of effectively decreasing the adhesion strength between the outer layer and the inner layer to enable the outer layer to be peeled significantly simply during cutting work.

Accordingly, the outer layer in the present embodiment can be configured to have the multilayer structure including, for example, the TiC layer, the TiN layer, and the TiC layer stacked in this order from the outer layer's side in contact with the Al$_2$O$_3$ layer. The multilayer structure of the outer layer, however, may include three or more layers and preferably includes 3 to 5 layers. The upper limit of the number of stacked layers in the multilayer structure is not to be particularly limited but is preferably set to 7 layers. The outer layer formed of more than 7 layers makes a little difference in the effect of improving the deposition resistance to sometimes give an economic disadvantage.

The outer layer preferably has, as the whole multilayer structure, an average thickness of greater than or equal to 0.1 µm and less than or equal to 2 µm, and the upper limit of the average thickness is more preferably 1.5 µm, further preferably 1 µm and the lower limit of the average thickness is more preferably 0.2 µm, further preferably 0.3 µm. The outer layer having, as the whole multilayer structure, an average thickness of less than 0.1 µm makes the effects of the outer layer insufficient, and the outer layer having, as the whole multilayer structure, an average thickness of more than 2 µm makes a little difference in the effects to sometimes give an economic disadvantage.

Each of the layers constituting the multilayer structure preferably has an average thickness of greater than or equal to 0.05 µm and less than or equal to 1 µm, and the upper limit of the average thickness is more preferably 0.8 µm, further preferably 0.6 µm and the lower limit of the average thickness is more preferably 0.1 µm, further preferably 0.2 µm. Each of the layers having an average thickness of less than 0.05 µm makes the effects brought about by the multilayer structure insufficient, and each of the layers having an average thickness of greater than 1 µm makes a little difference in the effects to sometimes give an economic disadvantage.

The composition of each of the layers constituting the inner layer and the outer layer can be confirmed by the same method as the method of measuring the composition of the substrate described above. That is, a polished surface for observation is produced on a substrate covered with a coating. A coating part on the polished surface for observation is observed at any five locations (five fields) using an EDX at a magnification of ×5000 and subjected to elemental analysis, an average value of values in the five fields is derived for each element, and the average value can be defined as the composition. Here, any five locations (five fields) of the coating part is set for each of the layers constituting the coating. The interfaces between layers appear on the polished surface for observation to allow positional relationships between layers to be figured out, so that it is possible to set any five locations (five fields) for each of the layers.

Further, observation using a scanning electron microscope (SEM) can be performed to measure the film thickness of the coating, the inner layer and the outer layer that constitute the coating, the $Al_2O_3$ layer, and each of the layers constituting the multilayer structure of the outer layer. Specifically, first, a flank face of a substrate that is at least covered with a coating is cut along a plane in parallel with a normal to the flank face to expose a cross-sectional surface of the flank face. Subsequently, at least a coating part (coating cross-sectional surface) of this exposed cross-sectional surface is polished to produce a polished surface for observation. On this polished surface for observation, observation is performed at any five locations (five fields) on each of the coating, an inner layer and an outer layer that constitute the coating, an $Al_2O_3$ layer, and layers constituting the outer layer of the polished surface for observation, using an SEM at a magnification of ×5000 to measure the film thickness of the coating, the inner layer and the outer layer that constitute the coating, and the $Al_2O_3$ layer, and at a magnification of ×20000 to measure the film thickness of each of the layers constituting the outer layer, and the values of the film thickness in the five fields are derived. Last, an average value of the values in the five fields is derived and can be defined as the average thickness.

For polishing the cross-sectional surface of the coating, it is possible to use a conventionally known method. Polishing the cross-sectional surface of the coating can be performed by, for example, the same method as the method of measuring the composition of the substrate described above, that is by a method using ion-milling. The conditions of ion-milling are as follows, for example.
Accelerating voltage: 6 kV
Irradiation angle: 0 to 5° from normal direction to flank face of substrate
Irradiation time: 6 hours Then, the polished surface for observation of the coating that has been flattened and smoothed may be observed with an SEM as described above.

Here, a surface of the coating and the interfaces between layers that constitute the coating are observed with an SEM to clarify that many of the surface and the interfaces are not flat and smooth surfaces but surfaces having protrusions and recesses. Accordingly, as regards an outline corresponding to the surface of the coating and boundaries corresponding to the interfaces between layers that appear on the cross-sectional surface of the coating in a field, many of the outline and the boundaries are not also straight lines but wavy lines. Thus, in measuring the film thickness of the coating and each of the layers, first determined is a middle point between a top point and a bottom point of each of lines in a field. Further, each of virtual lines is set that passes this middle point and is in parallel with a surface (flank face) of the substrate, and the virtual lines are defined as reference lines. Next, the reference lines corresponding to the outline and the boundaries are sequentially set to desirably define the distance between reference lines as the film thickness of the coating or each of the layers.

(Voids in Interface between Inner Layer and Outer Layer)

In the present embodiment, the coating preferably includes a plurality of voids in an interface between the inner layer and the outer layer. The voids have an average diameter of greater than or equal to 10 nm and less than or equal to 100 nm. Further, the voids have a density of 0.1 to 2 pieces/µm on a cross-sectional surface of the coating that is obtained by cutting the coating along a plane in parallel with a normal to a flank face of the substrate. These voids are made to have an average diameter within the predetermined range and to be included in the interface between the inner layer and the outer layer at the predetermined density by controlling film formation conditions as in a method of manufacturing a surface-coated cutting tool described later. The surface-coated cutting tool according to the present embodiment includes such voids to be capable of effectively decrease the adhesion strength between the outer layer and the inner layer and thus enable the outer layer to be peeled significantly simply during cutting work.

Here, the phrase "including a plurality of voids in an interface" means the following. That is, precisely speaking, existence of the voids on the interface eliminates the interface at locations where the voids exist. In the present specification, however, description is made as follows while the coating is considered to "include a plurality of voids in an interface, assuming the interface that would have existed without the voids.

The voids more preferably have an average diameter of greater than or equal to 20 nm and less than or equal to 80 nm. The voids having an average diameter of less than 10 nm makes insufficient the action of effectively decreasing the adhesion strength between the outer layer and the inner layer. The voids having an average diameter of more than 100 nm may possibly allow the outer layer to be peeled before the outer layer is effectively peeled during cutting work.

The voids more preferably have a density of 0.3 to 1.8 pieces/µm on a cross-sectional surface of the coating that is obtained by cutting the coating along a plane in parallel with a normal to a flank face of the substrate. The voids having a density of less than 0.1 pieces/µm makes insufficient the action of effectively decreasing the adhesion strength between the outer layer and the inner layer. The voids having a density of more than 2 pieces/µm may possibly allow the outer layer to be peeled before the outer layer is effectively peeled during cutting work.

The average diameter and the density of the voids can be measured by observation using an SEM in the same manner as in the method of measuring the film thickness of the coating, the inner layer, the outer layer, and the like described above. Prepared is a polished surface for observation that is for measuring the film thickness of the coating described above, and measurement is performed at any five locations (five fields) on the polished surface for observation using an SEM at a magnification of ×20000. At the five locations, however, each field is to include the interface between the outer layer and the inner layer. The average diameter of voids can be derived by deriving average diameters of voids in the fields from all the voids having a diameter of greater than or equal to 10 nm and defining an average value of the average diameters as the average diameter of the voids. The density of voids can be derived by counting the number of voids used to derive the above average diameter, deriving the densities of the voids in each field, and defining an average value of the densities as the density of the voids.

Here, in the present embodiment, when the average diameter and the density of voids are measured, a void whose portion is even slightly included in the interface between the inner layer and the outer layer is to be an object to be measured for the average diameter and the density. The diameter of a void that is an ellipse is to be calculated by measuring a minor axis of the ellipse.

<Cutting Edge Portion>
(Surface Roughness Ra)

In the surface-coated cutting tool according to the present embodiment, a cutting edge portion preferably has a surface roughness Ra of less than or equal to 0.1 µm. The present inventors have seriously and repetitively studied to enable a cutting edge portion to have significantly flat and smooth surface roughness Ra by, for example, covering the substrate with the coating and then subjecting a surface of the coating to flattening and smoothing under specific conditions as described later. The present inventors have found that this procedure particularly improves the deposition resistance of the surface-coated cutting tool while allowing the surface-coated cutting tool to maintain the wear resistance of a conventional surface-coated cutting tool.

In the present specification the "cutting edge portion" refers to a part formed of a cutting edge ridge that is a part where a rake face intersects with a flank face, and a vicinity region of the cutting edge ridge. Here, the vicinity region of the cutting edge ridge indicates a region sandwiched between a virtual line and the cutting edge ridge on the rake face and the flank face, with the virtual line passing a point distanced from the cutting edge ridge by 50 μm along the cutting edge ridge. Further, the "cutting edge ridge portion" of the substrate and the base substrate described above indicates a part corresponding to the "cutting edge portion" on the substrate.

However, when surface finishing such as honing or formation of a negative land is performed on the cutting edge ridge portion of the substrate as described above, the cutting edge ridge is described assuming the cutting edge ridge that has not been subjected to these types of surface finishing. This is because these types of surface finishing are performed to eliminate the cutting edge ridge as a line and thus make it difficult to clearly determine the range of the cutting edge portion. Accordingly, when the surface-coated cutting tool has undergone surface finishing, the cutting edge ridge is recognized as a line formed by intersection between the rake face and the flank face that are virtually extended, to determine the range of the cutting edge portion.

In the present embodiment, the cutting edge portion more preferably has a surface roughness Ra of less than or equal to 0.08 μm. Further, the cutting edge portion most preferably has a surface roughness Ra of less than or equal to 0.06 μm. The cutting edge portion ideally has a surface roughness Ra of 0 μm as a lower limit value. The cutting edge portion having a surface roughness Ra of more than 0.1 μm makes insufficient the effect of flat and smooth surface roughness, in consideration of particularly excellent deposition resistance.

The surface roughness Ra of the cutting edge portion can be measured using an atomic force microscope (AFM) in accordance with JIS R 1683: 2007 on the basis of the terms and the definitions that are used in JIS B 0601: 2013. The surface roughness Ra can be determined by setting a 10 μm×10 μm region at any ten locations on the cutting edge portion, measuring each of the regions for its surface shape through scanning with a probe of the AFM, and calculating an average value of the surface roughness Ra of ten locations measured.

In the present embodiment, a value of less than or equal to 0.1 μm as the surface roughness Ra of the cutting edge portion can be achieved by forming a coating on a substrate and then subjecting a cutting edge portion of the substrate to, for example, flattening and smoothing described later. A method of obtaining a cutting edge portion that has a surface roughness Ra of less than or equal to 0.1 μm, however, is not to be limited to the flattening and smoothing as long as the method is capable of achieving the value.

<<Method of Manufacturing Surface-Coated Cutting Tool>>

The surface-coated cutting tool according to the present embodiment can be manufactured by preparing a substrate having the configuration described above through a combination of conventionally known methods, appropriately controlling, for example, film formation conditions, and covering the substrate with a coating having the configuration described above. Particularly, the substrate is preferably subjected to flattening and smoothing under predetermined conditions after covered with the coating. Hereinafter, a method of manufacturing a surface-coated cutting tool is described.

<Preparation of Substrate>

(Blending and Mixing Raw Material Powders)

First, raw material powders for a substrate are prepared that have composition described later. First, the powders are blended by a conventionally known blending method to satisfy the composition of 7.5 to 10.5% by mass of cobalt and 2 to 6% by mass of a carbide of a first metal, with the balance being tungsten carbide and inevitable impurities. The kind of the first metal and the kinds and contents of the inevitable impurities are as described above.

Subsequently, the blended material obtained by blending described above is subjected to wet blending. For the wet blending, it is also possible to use a conventionally known method. For example, the wet blending can be performed using a commercially available wet attritor for about 6 hours to prepare a raw material powder for cemented carbide.

(Press Molding and Sintering)

Next, the raw material powder for cemented carbide is charged into a predetermined mold and subjected to press molding by a conventionally known method. For example, the press molding can be performed using a commercially available press machine at a pressure of 20 to 50 kPa. Further, a molded body that has undergone the press molding is sintered. For the sintering, it is also possible to use a conventionally known method, and the molded body can be sintered by a conventionally known method under the conditions of 1350 to 1550° C. for 0.5 to 2 hours to produce a sintered material of cemented carbide. Thus, it is possible to prepare a substrate formed of cemented carbide. Here, in the present embodiment, the raw material powder for cemented carbide and the substrate are to have identical composition.

(Other Steps)

Further, in the method of manufacturing the surface-coated cutting tool according to the present embodiment, honing or formation of a negative land can be performed, as another step, on a cutting edge ridge portion of the substrate.

<Covering with Coating>

The surface-coated cutting tool can be suitably manufactured by covering a surface of the substrate formed of cemented carbide with a coating by a CVD method. The coating is formed in the order of an inner layer and an outer layer.

(Formation of Inner Layer)

When layers other than the $Al_2O_3$ layer are formed as the inner layer, the layers can be formed by a conventionally known method. The thickness of the $Al_2O_3$ layer and another layer can be adjusted by appropriately arranging the film formation time (the rate of film formation in each layer is about 0.5 to 2 μm/h).

The inner layer can be formed as follows by, for example, a CVD method. That is, a TiCN layer is formed by a known method on the substrate with or without another layer interposed between the substrate and the TiCN layer, and a TiCNO layer is formed on a surface of this TiCN layer. Further, a surface of the TiCNO layer is oxidized by introducing a raw material gas described later, and nucleation of α-Al$_2$O$_3$ crystal grains is performed, followed by accelerating growth of the Al$_2$O$_3$ crystal grains to form an Al$_2$O$_3$ layer.

For example, in the formation of the Al$_2$O$_3$ layer, the blending amount of various gases blended in the raw material gas is 1.3 to 2.5% by volume for AlCl$_3$, 2 to 6% by volume for HCl, 0.2 to 2% by volume for H$_2$S, and 0.6 to 6% by volume for CO$_2$, with the balance being H$_2$. At this time, the furnace temperature is set to 950 to 1050° C. and the furnace pressure is set to 5 to 150 hPa in a CVD apparatus. The Al$_2$O$_3$ layer is preferably formed so as to have an average thickness of 0.5 to 4 µm.

(Formation of Outer Layer)

The outer layer can be formed through film formation by a CVD method, following the formation of the inner layer. At this time, it is preferable to introduce a mixed gas formed of two components, i.e., hydrogen and carbon dioxide onto the Al$_2$O$_3$ layer after the formation of the Al$_2$O$_3$ layer. This procedure enables a surface of the Al$_2$O$_3$ layer to contain a small amount of moisture to allow voids having the average diameter and the density that are described above to exist in an interface region between the Al$_2$O$_3$ layer and the outer layer formed subsequently. The ratio between H$_2$ and CO$_2$ in the mixed gas is preferably H$_2$:CO$_2$=70:1 to 30:1.

The outer layer is formed as a stacking structure including three or more layers. Further, each of the layers constituting the multilayer structure is made to contain titanium. Particularly, it is preferable to form the outer layer by stacking three or more layers that include a TiC layer and a TiN layer. Further, the outer layer more preferably includes the TiC layer as a layer in contact with the Al$_2$O$_3$ layer included in the inner layer. For example, the outer layer can be formed that has a three layer structure including the TiC layer as a layer in contact with the Al$_2$O$_3$ layer, a TiN layer stacked on the TiC layer, and one selected from among TiCN, TiBN, TiCNO, TiZrN, TiZrCrN, and TiC as an outermost layer stacked on this TiN layer. It is to be noted that the outer layer has a multilayer structure including three or more layers, and the outer layer may have four layers, five layers, or more than five layers.

Each of the layers included in the outer layer can be formed by a conventionally known method. The thickness of each of the layers can be adjusted by appropriately arranging the film formation time (the rate of film formation in each layer is about 0.5 to 2 µm/h). Thus, it is possible to manufacture a surface-coated cutting tool including a substrate whose surface is covered with a coating formed of an inner layer and an outer layer.

<Flattening and Smoothing>

Further, in the present embodiment, it is possible to perform flattening and smoothing on a cutting edge portion of the surface-coated cutting tool including the substrate whose surface is covered with the coating. As the flattening and smoothing, brushing can be performed, for example. The brushing can be performed by, for example, scrubbing the cutting edge portion with a nylon brush while rotating the surface-coated cutting tool whose cutting edge portion has been coated with a diamond paste having an average particle diameter of less than or equal to 10 µm, with a through hole in the center of a rake face set as a shaft axis, at a rate of about 15 to 50 rpm for about 0.2 minutes, and then air-cooling the cutting edge portion. In the flattening and smoothing of the present embodiment, it is preferable to repeat this operation three to five times. This makes the surface roughness Ra of the cutting edge portion less than or equal to 0.1 µm. That is, it is possible to make a region sandwiched between a virtual line and a cutting edge ridge on the rake face and a flank face into a significantly flat and smooth region having a surface roughness Ra of less than or equal to 0.1 µm, the virtual line passing a point distanced from the cutting edge ridge by 50 µm along the cutting edge ridge.

As regards the flattening and smoothing, a conventionally widely known various types of blasting (such as sandblasting and shot peening) other than the brushing may be applied as long as the cutting edge portion can be made to have a surface roughness Ra of less than or equal to 0.1 µm.

EXAMPLES

Hereinafter, the present invention is described in more detail with reference to examples. The present invention, however, is not limited to these examples.

In the present examples, the layers constituting the coating (the inner layer and the outer layer) are formed by a CVD method unless otherwise specified, and Table 1 below shows the conditions of the method.

TABLE 1

| Coating | Composition of raw material gas (% by volume) | Temperature (° C.) | Pressure (kPa) |
| --- | --- | --- | --- |
| TiN (lowermost layer) | TiCl$_4$: 1.0%, N$_2$: 40.0%, H$_2$: balance | 850 | 7 |
| TiN (other than lowermost layer) | TiCl$_4$: 2.0%, N$_2$: 30.0%, H$_2$: balance | 1000 | 20 |
| MT-TiCN | TiCl$_4$: 2.0%, N$_2$: 20.0%, CH$_3$CN: 0.5%, H$_2$: balance | 900 | 10 |
| TiCN | TiCl$_4$: 2.0%, N$_2$: 20.0%, CH$_4$: 3.5%, H$_2$: balance | 980 | 20 |
| TiCNO | TiCl$_4$: 1.5%, CO: 1.5%, CH$_4$: 4.0%, N$_2$: 20.0%, H$_2$: balance | 1000 | 20 |
| TiC | TiCl$_4$: 2.0%, CH$_4$: 5.0%, H$_2$: balance | 950 | 50 |
| κ-Al$_2$O$_3$ | AlCl$_3$: 2.0%, CO$_2$: 5.0%, H$_2$S: 0.3%, HCl: 3.0%, H$_2$: balance | 1000 | 6 |
| α-Al$_2$O$_3$ | AlCl$_3$: 3.0%, CO$_2$: 3.5%, H$_2$S: 0.4%, HCl: 3.0%, H$_2$: balance | 980 | 6 |

In Table 1, the "composition of raw material gas" refers to the composition of a gas used to form each layer by the CVD method and the "temperature" and the "pressure" refer to the temperature and the pressure during the formation.

In Table 1, the "TiN (lowermost layer)" indicates the conditions when a TiN layer is formed so as to be in direct contact with a surface of the substrate, and the "TiN (other than lowermost layer)" indicates the conditions when a TiN layer is formed at a stacking position other than the lowermost position. Indicated by MT-TiCN is a case where a TiCN layer is formed at relatively low film formation temperature (850 to 900° C.) (hereinafter, described as "MT-TiCN layer"). Indicated by κ-$Al_2O_3$ are the conditions for forming a layer formed of $Al_2O_3$ having a κ-type crystal structure (hereinafter, described as a "κ-$Al_2O_3$ layer") and indicated by α-$Al_2O_3$ are the conditions for forming a layer formed of $Al_2O_3$ having an α-type crystal structure (hereinafter, described as an "α-$Al_2O_3$ layer").

<Preparation of Substrate>

First, in order to prepare substrates corresponding to Samples No. 1 to 11, nine types of raw material powders for cemented carbide were prepared by the method described above, pressed at a pressure of 35 kPa, and subsequently sintered under the conditions of 1450° C. in a vacuum atmosphere and 1 hour to prepare base substrates corresponding to Samples No. 1 to 11. Further, cutting edge finishing was performed on a cutting edge ridge portion of these base substrates by SiC brush horning to impart roundness (R) having a radius of about 50 μm to a part where the rake face intersects with the flank face, thus preparing substrates (made of cemented carbide) corresponding to Samples No. 1 to 11 having the same shape as the shape of the cutting tool in CNMG120408 (JIS B 4120:2013). Table 2 shows the composition of each of the substrates in Samples No. 1 to 11.

For example, the composition of the substrate in Sample No. 1 is 8% by mass of Co, 3.4% by mass of TiC, 1.0% by mass of TaC, and 1.5% by mass of NbC, with the balance being WC and inevitable impurities (Table 2 shows no inevitable impurities). Any of the crystals of carbides contained in the substrates of Samples No. 1 to 11 was cubic. In the present examples, 4 substrates were prepared for each of Samples No. 1 to 11.

TABLE 2

| Sample No. | Composition of substrate |
| --- | --- |
| 1 | Co (8.0%)-TiC (3.4%)-TaC (1.0%)-NbC (1.5%)-WC (balance) |
| 2 | Co(9.0%)-TiC(3.0%)-TaC(0.5%)-NbC(1.0%)-ZrC(1.0%)-WC(balance) |
| 3 | Co(9.5%)-TiC(2.0%)-TaC(1.0%)-NbC(1.0%)-ZrC(0.5%)-WC(balance) |
| 4 | Co(10.0%)-TiC(1.0%)-TaC(0.2%)-NbC(1.0%)-ZrC(0.2%)-WC(balance) |
| 5 | Co(8.0%)-TiC(3.4%)-TaC(1.0%)-NbC(1.5%)-WC(balance) |
| 6 | Co(10.7%)-TiC(3.4%)-TaC(1.0%)-NbC(1.5%)-WC(balance) |
| 7 | Co(8.0%)-TiC(3.4%)-TaC(1.0%)-NbC(1.5%)-WC(balance) |
| 8 | Co(11.0%)-TiC(3.4%)-TaC(1.0%)-NbC(1.5%)-WC(balance) |
| 9 | Co(9.0%)-TiC(3.0%)-TaC(0.5%)-NbC(0.8%)-ZrC(1.0%)-WC(balance) |
| 10 | Co(9.0%)-TiC(3.0%)-TaC(0.5%)-NbC(0.8%)-ZrC(1.0%)-WC(balance) |
| 11 | Co(8.0%)-TiC(3.4%)-TaC(1.0%)-NbC(1.5%)-WC(balance) |

<Covering with Coating>

(Formation of Inner Layer)

Next, a TiN layer, a MT-TiCN layer, a TiCNO layer, and an $Al_2O_3$ layer (layer in contact with the outer layer) were formed in this order as the inner layer on the whole surface of each of the substrates in Samples No. 1 to 11 under the formation conditions for each layer described in Table 1. Table 3 shows the film structure and the film thickness of each of the layers constituting the inner layer.

(Formation of Outer Layer)

Further subsequently, an outer layer was formed for Samples No. 1 to 11 each having the inner layer formed therein, so as to have the film structure and the film thickness that were indicated in Table 3 under the formation conditions for each layer described in Table 1. In the present examples, Samples No. 1 to 8 correspond to the examples and Samples No. 9 to 11 correspond to comparative examples as described later.

In the present examples, particularly as regards Samples No. 1 and 3, a mixed gas formed of hydrogen and carbon dioxide was introduced onto the $Al_2O_3$ layer after the formation of the $Al_2O_3$ layer to allow a surface of the $Al_2O_3$ layer to contain a small amount of moisture. The volume ratio between hydrogen and carbon dioxide in the mixed gas is $H_2:CO_2=50:1$. Further, the temperature is 1000° C. and the pressure is 10 kPa in a CVD apparatus during the introduction of the mixed gas.

TABLE 3

| Sample No. | Film structure and film thickness (μm) |
| --- | --- |
| 1 | TiN(0.3)/MT-TiCN(8.1)/TiCNO(1.0)/α-$Al_2O_3$ (3.2)/TiC(0.3)/TiN(0.2)/TiC(0.2) |
| 2 | TiN(0.3)/MT-TiCN(8.1)/TiCNO(1.0)/α-$Al_2O_3$ (3.2)/TiC(0.2)/TiCN(0.3)/TiN(0.2)/TiC(0.3) |
| 3 | TiN(0.3)/MT-TiCN(8.1)/TiCNO(1.0)/κ-$Al_2O_3$ (3.2)/TiC(0.3)/TiN(0.2)/TiC(0.2)/TiN(0.2) |
| 4 | TiN(0.3)/MT-TiCN(8.1)/TiCNO(1.0)/α-$Al_2O_3$ (3.2)/TiCN(0.2)/TiC(0.2)/TiN(0.3) |
| 5 | TiN(0.3)/MT-TiCN(8.1)/TiCNO(1.0)/α-$Al_2O_3$ (3.2)/TiC(0.3)/TiN(0.2)/TiC(0.2) |
| 6 | TiN(0.3)/MT-TiCN(8.1)/TiCNO(1.0)/α-$Al_2O_3$ (3.2)/TiC(0.3)/TiN(0.2)/TiC(0.2) |
| 7 | TiN(0.3)/MT-TiCN(8.1)/TiCNO(1.0)/α-$Al_2O_3$ (3.2)/TiC(0.2)/TiCN(0.3)/TiN(0.2)/TiC(0.3) |
| 8 | TiN(0.3)/MT-TiCN(8.1)/TiCNO(1.0)/κ-$Al_2O_3$ (3.2)/TiC(0.3)/TiN(0.2)/TiC(0.2) |
| 9 | TiN(0.3)/MT-TiCN(8.1)/TiCNO(1.0)/α-$Al_2O_3$ (3.2)/TiCN(0.2)/TiN(0.2) |
| 10 | TiN(0.3)/MT-TiCN(8.1)/TiCNO(1.0)/α-$Al_2O_3$ (3.2)/TiC(0.3)/TiN(0.2) |
| 11 | TiN(0.3)/MT-TiCN(8.1)/TiCNO(1.0)/α-$Al_2O_3$ (3.2)/TiCN(0.2)/TiN(0.2) |

<Flattening and Smoothing>

Last, brushing was performed as flattening and smoothing on a cutting edge portion of each of Samples No. 1 to 11 having the outer layer formed therein. The conditions for the brushing are as follows.

Cutting edge portion coating material: diamond paste (average particle diameter: less than or equal to 10 μm)
Rotation rate: 50 rpm
Depth of cut: 1.0 mm
Material of brush: nylon
Air-cooling time after brushing: 1 minute Further, Table 4 shows the brushing time (at one time) and the number of brushing performed on the cutting edge portion of each of Samples No. 1 to 11.

TABLE 4

| | Average | | | | | Cutting performance | | |
| --- | --- | --- | --- | --- | --- | --- | --- | --- |
| Sample No. | Brushing time (s) | Number of brushing (times) | diameter of voids (nm) | Density of voids (piece/μm) | Surface roughness Ra (μm) | Wear resistance Vb (mm) | State of cutting edge | Rank of performance |
| 1 | 0.2 | 4 | 70 | 1.6 | 0.04 | 0.142 | No deposition | A |
| 2 | 0.2 | 3 | 45 | 1.3 | 0.08 | 0.152 | No deposition | A |
| 3 | 0.2 | 4 | 75 | 1.6 | 0.06 | 0.155 | No deposition | A |
| 4 | 0.2 | 5 | 18 | 0.4 | 0.1 | 0.161 | Occurrence of slight deposition | B |
| 5 | 0.2 | 3 | 36 | 1.0 | 0.1 | 0.140 | Occurrence of slight deposition | B |
| 6 | 0.2 | 3 | 51 | 1.4 | 0.09 | 0.158 | No deposition | A |
| 7 | 0.2 | 3 | 46 | 1.2 | 0.05 | 0.148 | No deposition | A |
| 8 | 0.2 | 4 | 73 | 1.1 | 0.08 | 0.183 | No deposition | B |
| 9 | 0.2 | 3 | 7 | 0.08 | 0.13 | 0.157 | Occurrence of deposition | C |
| 10 | 0.2 | 3 | 47 | 1.3 | 0.06 | 0.162 | Occurrence of deposition and chipping | C |

TABLE 4-continued

| Sample No. | Brushing time (s) | Number of brushing (times) | Average diameter of voids (nm) | Density of voids (piece/μm) | Surface roughness Ra (μm) | Cutting performance | | |
|---|---|---|---|---|---|---|---|---|
| | | | | | | Wear resistance Vb (mm) | State of cutting edge | Rank of performance |
| 11 | 0.2 | 3 | 9 | 0.06 | 0.12 | 0.155 | Occurrence of deposition | C |

<Contents of Tests>

As regards the surface-coated cutting tools of Samples No. 1 to 11 obtained as described above, 4 pieces were prepared for each of Samples No. 1 to 11. As regards one of the 4 pieces of Samples No. 1 to 11, the surface roughness Ra of the cutting edge portion was measured using an AFM. The measurement method is as described above.

As regards another piece of Samples No. 1 to 11, the measurement method described above was used to derive the average diameter and the density of a plurality of voids that exist along an interface region between the inner layer and the outer layer. Another piece of Samples No. 1 to 11 was evaluated for wear resistance, and the other piece was evaluated for deposition resistance. The evaluations of wear resistance and deposition resistance were performed on the basis of cutting tests under the following conditions, respectively.

(Cutting Test for Evaluating Wear Resistance)
Workpiece: SCM435 (JIS)
Cutting rate: 250 m/min
Feed: 0.3 mm/rev.
Depth of cut: 2.0 mm
Wet/Dry: wet
Cutting time: 20 min
(Cutting Test for Evaluating Deposition Resistance)
Workpiece: SCM415 (JIS)
Cutting rate: 80 m/min
Feed: 0.3 mm/rev
Depth of cut: 1.5 mm
Wet/Dry: wet
Cutting time: 5 min
<Evaluations>

Table 4 shows the evaluation results of the surface roughness Ra of the cutting edge portion by an AFM, the wear resistance, and the deposition resistance. The surface roughness Ra with a smaller value represents a flatter and smoother surface and more contribution to improvement of the deposition resistance. In the evaluation of wear resistance, the amount of wear (Vb) on the flank face was measured after the cutting for 20 minutes. The Vb with a smaller value represents more excellent wear resistance. Further, in the evaluation of deposition resistance, the state of deposition on the cutting edge portion was observed after the cutting for 5 minutes. In Table 4, the expression "no deposition" in the evaluation of deposition resistance means occurrence of neither deposition nor chipping, the expression "occurrence of slight deposition" means that a slight amount of deposition was confirmed but the degree of deposition did not affect continuation of the cutting work for the workpiece and that no chipping occurred, the expression "occurrence of deposition" means that deposition was confirmed but no chipping occurred, and the expression "occurrence of deposition and chipping" means that both deposition and chipping occurred.

Further, Table 4 shows ranks of performance represented by, for example, the alphabet A, and the ranks are defined as follows.

A: Very excellent in wear resistance and deposition resistance (satisfying all of the total three items of the surface roughness Ra being less than or equal to 0.1, the Vb being less than or equal to 0.161, and the state of the cutting edge being no deposition)

B: Excellent in wear resistance and deposition resistance (satisfying two of the total three items of the surface roughness Ra being less than or equal to 0.1, the Vb being less than or equal to 0.161, and the state of the cutting edge being no deposition)

C: Insufficient in wear resistance and deposition resistance (Incapable of satisfying two of the total three items of the surface roughness Ra being less than or equal to 0.1, the Vb being less than or equal to 0.161, and the state of the cutting edge being no deposition)

Table 4 clarifies that all the surface-coated cutting tools of Samples No. 1 to 8 corresponding to the examples are equal to or more excellent than the surface-coated cutting tools of Samples No. 9 to 11 corresponding to the comparative examples in surface roughness Ra and wear resistance and are much more excellent in deposition resistance.

Particularly, Samples No. 1 and 3 that were prepared by introducing the mixed gas formed of hydrogen and carbon dioxide onto the $Al_2O_3$ layer in the process of producing the coating, and Samples No. 2, 6, and 7 were suitable in any of the surface roughness Ra, the average diameter and the density of the voids, the film structure of the outer layer, and the cobalt content of the substrate (cemented carbide), so that the samples were remarkably excellent in wear resistance and deposition resistance.

As described above, the embodiment and the examples of the present invention have been described, and the configurations of the embodiment and the examples described above have been planned to be appropriately combined from the beginning.

The embodiment and the examples that have been disclosed this time are to be considered as exemplification and not to be considered as restrictive in all aspects. The scope of the present invention is defined by the claims, rather than the embodiment described above, and is intended to include any modifications within the scope and meaning equivalent to the claims.

The invention claimed is:

1. A surface-coated cutting tool comprising a substrate and a coating that is disposed on the substrate and formed so as to cover at least a portion of a flank face,
    wherein
    the coating includes an inner layer and an outer layer formed on the inner layer,
    the inner layer is formed of at least one layer and includes an aluminum oxide layer as a layer in contact with the outer layer, the outer layer has a multilayer structure that includes three or more layers stacked on top of one another, each of the layers that constitute the multilayer structure is composed of a compound containing titanium and has an average thickness of greater than or equal to 0.05 μm and less than or equal to 1 μm, the coating includes a plurality of voids in an interface between the inner layer and the outer layer, the voids have an average diameter of greater than or equal to 10 nm and less than or equal to 80 nm and have a density of 1.1 to 2 pieces/μm on a cross-sectional surface of the coating obtained by cutting the coating along a plane in parallel with a normal to the flank face, the inner layer has an average thickness of greater than or equal to 0.5 μm and less than or equal to 20 μm, and the aluminum oxide layer being the layer that is included in the inner layer and is in contact with the outer layer has an average thickness of 0.5 to 4 μm.

2. The surface-coated cutting tool according to claim 1, wherein a cutting edge portion of the surface-coated cutting tool has a surface roughness Ra of less than or equal to 0.1 μm.

3. The surface-coated cutting tool according to claim 1, wherein the multilayer structure includes a titanium carbide layer and a titanium nitride layer.

4. The surface-coated cutting tool according to claim 1, wherein the multilayer structure includes a titanium carbide layer as a layer in contact with the aluminum oxide layer being the layer that is included in the inner layer and is in contact with the outer layer.

5. The surface-coated cutting tool according to claim 1, wherein the substrate is formed of cemented carbide, the cemented carbide contains, as composition, 7.5 to 10.5% by mass of cobalt and 2 to 6% by mass of a carbide of a first metal, with the balance being tungsten carbide and inevitable impurities, and the first metal is at least one metal selected from the group consisting of group-4 elements, group-5 elements, and group-6 elements in a periodic table.

\* \* \* \* \*